United States Patent [19]

Mathews et al.

[11] Patent Number: 5,580,821
[45] Date of Patent: Dec. 3, 1996

[54] SEMICONDUCTOR PROCESSING METHOD OF FORMING AN ELECTRICALLY CONDUCTIVE CONTACT PLUG

[75] Inventors: Viju K. Mathews; Nanseng Jeng; Pierre C. Fazan, all of Boise, Id.

[73] Assignee: Micron Technology, Inc., Boise, Id.

[21] Appl. No.: 391,719

[22] Filed: Feb. 21, 1995

[51] Int. Cl.$^6$ ................................................. H01L 21/44
[52] U.S. Cl. ..................... 437/187; 437/192; 437/195; 437/947; 437/981; 156/636.1
[58] Field of Search .................................... 437/187, 192, 437/195, 235, 237, 947, 981; 148/DIG. 161; 156/636

[56] References Cited

U.S. PATENT DOCUMENTS

| | | | |
|---|---|---|---|
| 4,936,950 | 6/1990 | Doan et al. | 437/192 |
| 5,244,534 | 9/1993 | Yu et al. | 156/636 |
| 5,269,880 | 12/1993 | Jolly et al. | 156/643 |
| 5,286,675 | 2/1994 | Chen et al. | 437/192 |
| 5,320,979 | 6/1994 | Hashimoto et al. | 437/192 |
| 5,371,042 | 12/1994 | Ong | 437/192 |

*Primary Examiner*—George Fourson
*Assistant Examiner*—Thomas G. Bilodeou

*Attorney, Agent, or Firm*—Wells, St. John, Roberts, Gregory & Matkin, P.S.

[57] ABSTRACT

A semiconductor processing method of forming an electrically conductive contact plug relative to a wafer includes, a) providing a substrate to which electrical connection is to be made; b) depositing a layer of first material atop the substrate to a selected thickness; c) pattern masking the first material layer for formation of a desired contact opening therethrough; d) etching through the first material layer to form a contact opening therethrough for making electrical connection with the substrate, the contact opening having an outermost region; e) after etching to form the contact opening, removing the masking from the first material layer; f) after removing the masking from the first material layer, facet sputter etching into the first material layer relative to the contact opening to provide outwardly angled sidewalls which effectively widen the contact opening outermost region, the outwardly angled sidewalls having an inner base where they join with the original contact opening; g) depositing a layer of conductive material atop the wafer and to within the facet etched contact opening to fill the contact opening; and h) etching the conductive material and first material layer inwardly to at least the angled sidewalls' inner base to define an electrically conductive contact plug which electrically connects with the substrate.

15 Claims, 3 Drawing Sheets

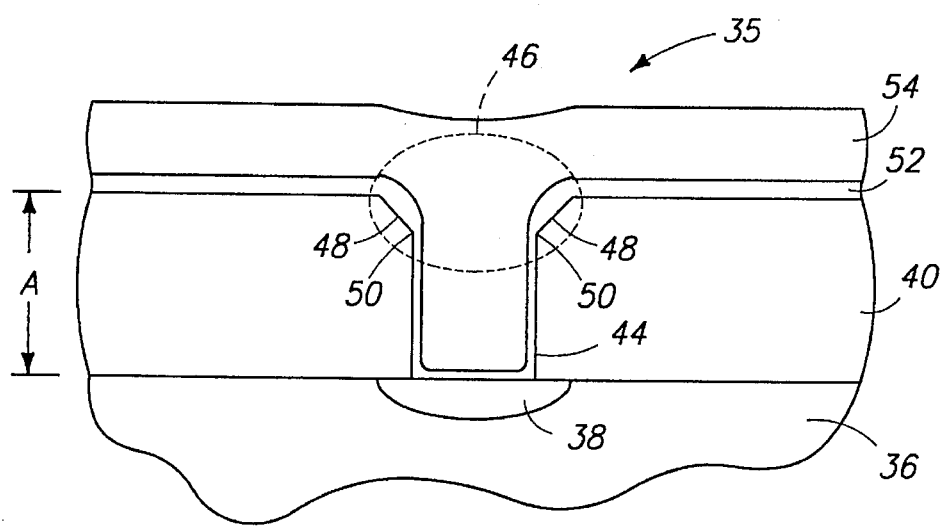
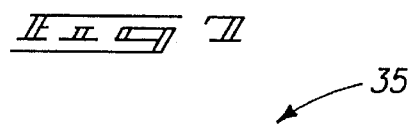
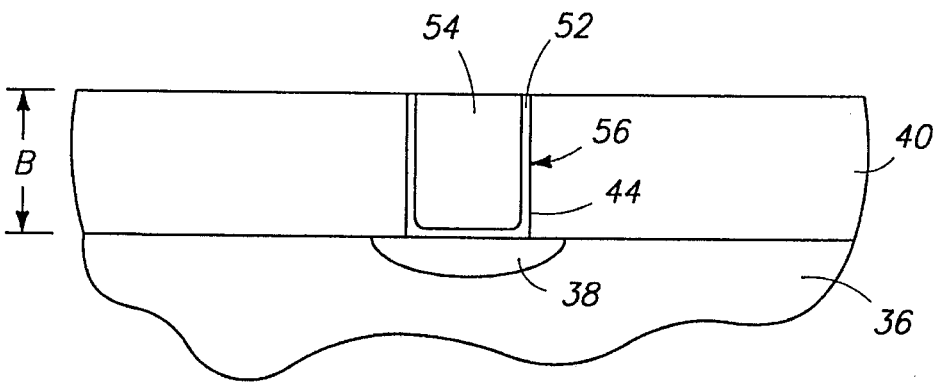
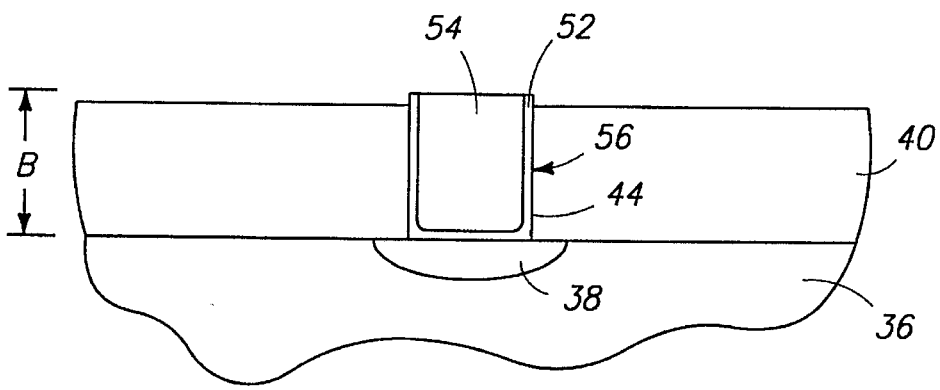
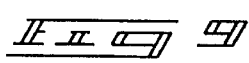

SEMICONDUCTOR PROCESSING METHOD OF FORMING AN ELECTRICALLY CONDUCTIVE CONTACT PLUG

TECHNICAL FIELD

This invention relates to semiconductor processing methods of forming an electrically conductive contact plug relative to a wafer.

BACKGROUND OF THE INVENTION

This invention arose out of problems associated with tungsten plug formation in contacts formed through silicon dioxide insulating layers. The problem is best understood with reference to the accompanying FIGS. 1 and 2. There illustrated is a semiconductor wafer fragment 10 comprised of a bulk substrate 12 and an overlying silicon dioxide layer 14, such as borophosphosilicate glass (BPSG). Bulk substrate 12 includes a dopant diffusion/active region 16 to which electrical connection is to be made. A contact opening 18 is provided through BPSG layer 14 to active area 16.

A thin layer 20 of titanium is deposited atop the wafer to within contact opening 18. Titanium layer 20 is provided to function as a silicide formation layer at the base of contact 18 for reducing resistance. An undesired oxide layer (not shown) also typically forms atop diffusion region 16. The deposited elemental titanium also functions to break-up this undesired oxide and thereafter form a titanium silicide with the silicon of substrate 12 to reduce contact resistance between active area 16 and subsequently deposited plug filling tungsten. Additionally, titanium layer 20 functions as an adhesion/nucleation layer for the subsequently deposited tungsten. Tungsten does not readily deposit over silicon dioxide and exposed silicon substrate, and the intervening titanium layer 20 facilitates deposition and adhesion of tungsten thereto.

Titanium layer 20 is typically deposited by sputter deposition, and undesirably results in formation of contact projecting cusps 22. This results in a back or re-entrant angle 24 being formed relative to contact opening 18. A layer 26 of tungsten is subsequently deposited with the intent being to completely fill the remaining volume of contact opening 18. Unfortunately, an undesired keyhole 28 typically forms, leaving a void within contact 18.

Referring to FIG. 2, layers 26 and 20 are subsequently etched back by dry etch of chemical-mechanical polishing to form a contact-filling plug 30. Undesirably, this typically opens-up the upper end of keyhole 28. In processing, this undesirably creates a thin void which is difficult to clean and rinse during processing. Also in the final construction, the outer surface area of plug 30 is reduced due to the void created by keyhole 28. This counters the desired goal of maximizing electrical contact with plug 30 with a subsequent layer for ultimately making electrical connection with active area 16. Further, the etch back typically conducted to produce plug 30 undesirably over-etches titanium layer 20, forming edge "fangs" 32.

One prior art solution for overcoming this problem is described with reference to FIG. 3. Like numerals are utilized where appropriate, such that only differences are described and numbered with a suffix "a". Here, BPSG layer 14 is angle-etched from its outer surface downwardly to active area 16. Subsequently deposited titanium layer 20 therefore does not form cusps, which will result in elimination of a keyhole by the subsequently deposited tungsten layer. This method is, however, highly undesirable as contact opening 18a has the added drawback of being narrower at its base than the illustrated FIGS. 1 and 2 embodiment, and also significantly wider at its outermost portion. This undesirably consumes precious wafer area and thereby counters the continuing semiconductor processing goals of making device components smaller and smaller.

It would be desirable to overcome these and other problems associated with formation of electrically conductive contact plugs. Although the invention principally arose out of concern specific to tungsten plug formation, the artisan will appreciate that the invention has applicability with other materials and constructions. The invention is intended to only be limited by the accompanying claims appropriately interpreted in accordance with the Doctrine of Equivalents.

BRIEF DESCRIPTION OF THE DRAWINGS

Preferred embodiments of the invention are described below with reference to the following accompanying drawings.

FIG. 7 is a view of the FIG. 4 wafer taken at a processing step subsequent to that shown by FIG. 6.

FIG. 8 is a view of the FIG. 4 wafer taken at a processing step subsequent to that shown by FIG. 7.

FIG. 9 is a view of the FIG. 4 wafer taken at a processing step subsequent to that shown by FIG. 8.

DETAILED DESCRIPTION OF THE PREFERRED EMBODIMENTS

Figure 1:
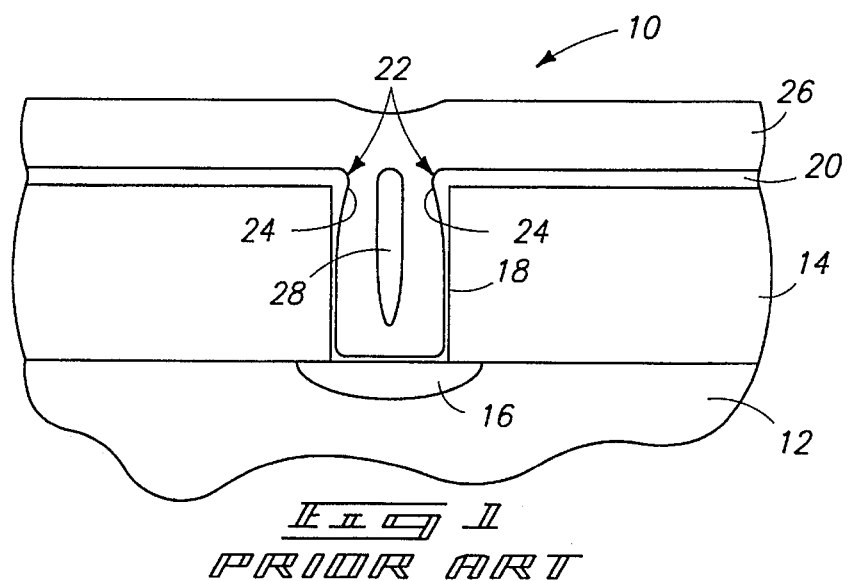
FIG. 1 is a diagrammatic sectional view of a prior art semiconductor wafer fragment, and is discussed in the "Background" section above.
Figure 2:
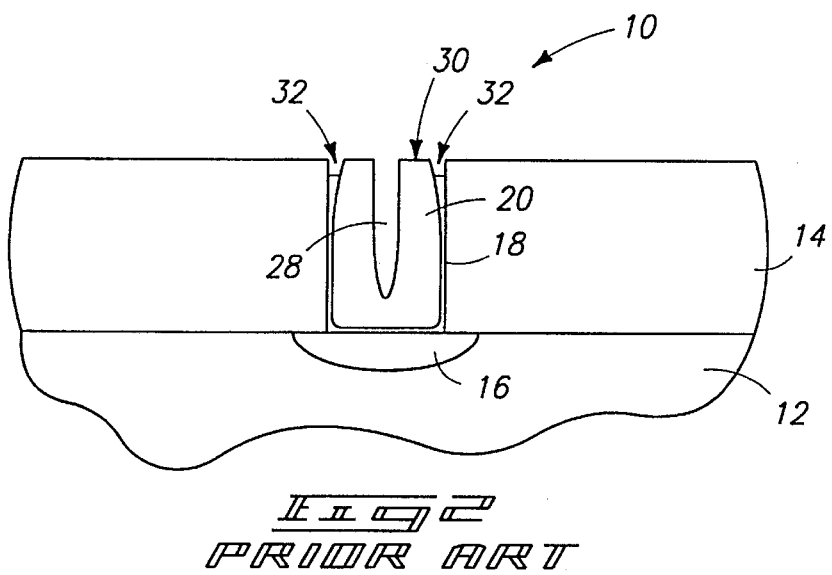
FIG. 2 is a view of the FIG. 1 wafer taken at a prior art processing step subsequent to that shown by FIG. 1.
Figure 3:
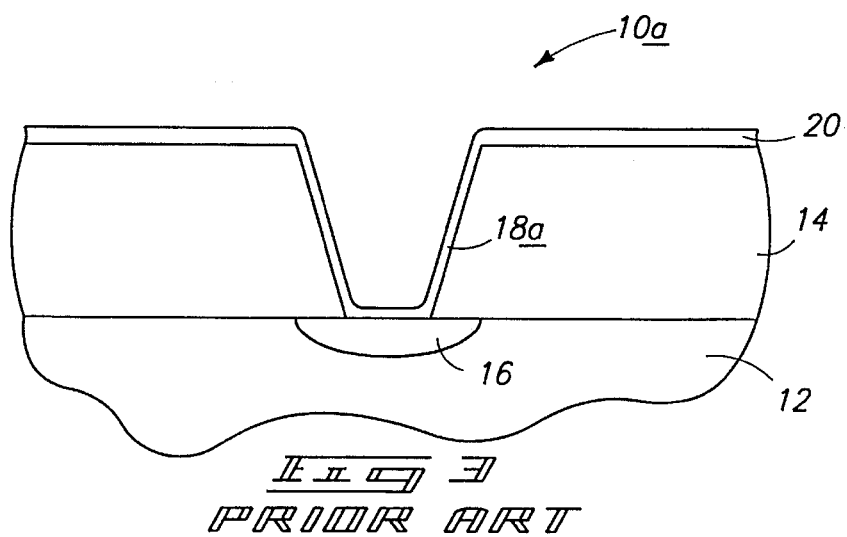
FIG. 3 is a diagrammatic sectional view of semiconductor wafer fragment illustrating another prior art process, and is discussed in the "Background" section above.
Figure 4:
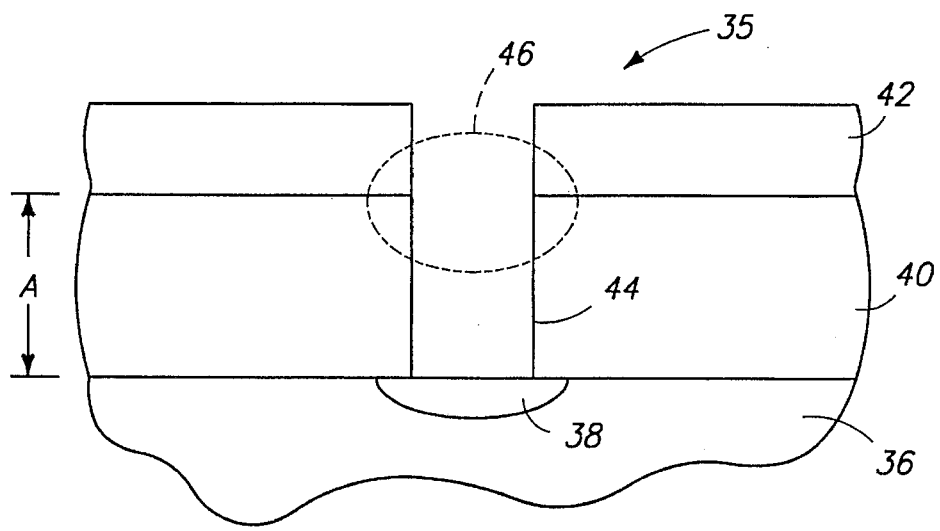
FIG. 4 is a diagrammatic sectional view of a wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming an electrically conductive contact plug relative to a wafer comprises the following steps:

providing a substrate to which electrical connection is to be made;

depositing a layer of first material atop the substrate to a selected thickness;

pattern masking the first material layer for formation of a desired contact opening therethrough;

etching through the first material layer to form a contact opening therethrough for making electrical connection with the substrate, the contact opening having an outermost region;

after etching to form the contact opening, removing the masking from the first material layer;

after removing the masking from the first material layer, facet sputter etching into the first material layer relative to the contact opening to provide outwardly angled sidewalls which effectively widen the contact opening outermost region, the outwardly angled sidewalls having an inner base where they join with the original contact opening;

depositing a layer of conductive material atop the wafer and to within the facet etched contact opening to fill the contact opening; and etching the conductive material and first material layer inwardly to at least the angled sidewalls' inner base to define an electrically conductive contact plug which electrically connects with the substrate.

More particularly and first with reference to FIGS. 4–8, a semiconductor wafer fragment at one processing step in accordance with the invention is indicated generally with reference numeral 35. Such comprises a bulk substrate 36 and active area 38 to which electrical connection is to be made. A layer 40 of a first material is deposited atop substrate 36 to a selected thickness "A". Preferably, the material of layer 40 comprises an electrically insulative material, with BPSG being one example preferred material. Layer 40 is patterned/masked for formation of a desired contact opening therethrough. Specifically and preferably, a layer 42 of photoresist is provided, and then first material layer 40 etched through to form a contact opening 44 for making electrical connection with substrate area 38. For purposes of the continuing discussion, contact opening 44 can be considered as having an outermost region, indicated generally by dashed outline 46.

An example etch of the BPSG oxide to form contact 44 would be a dry etch using a carbon/fluorene based chemistry, e.g., $CF_4$, $CHF_3$, and Ar. Argon is desirably added to provide a degree of physical sputtering in order to minimize polymer build-up.

Figure 5:
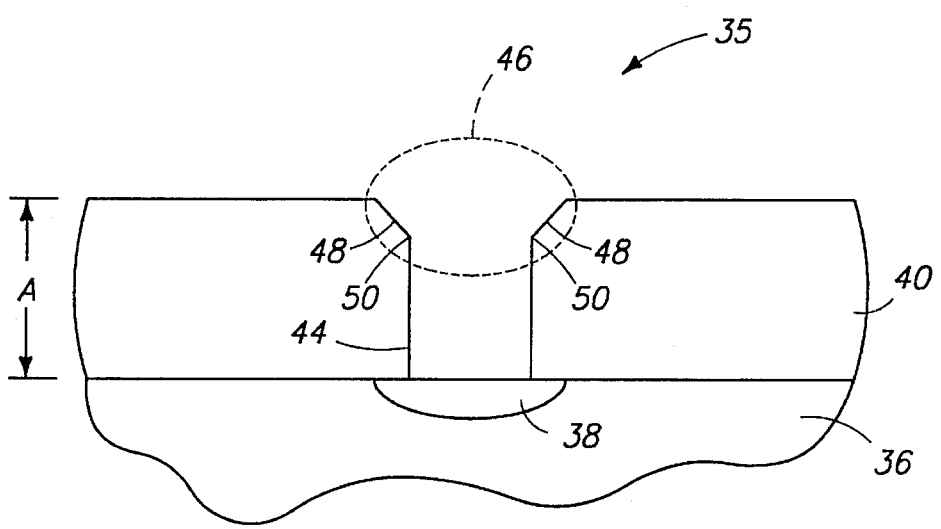
FIG. 5 is a view of the FIG. 4 wafer taken at a processing step subsequent to that shown by FIG. 4.

Referring to FIG. 5, masking layer 42 is removed after the etching which formed contact opening 44. Then, facet sputter etching is conducted into first material layer 40 relative to contact opening 44 to provide outwardly angled sidewalls 48, which effectively widens contact opening 44 outermost region 46. An example facet etching technique to produce sidewalls 48 includes first etching a contact in conventional reactive or non-reactive manner. Then, an oxygen etch is conducted to strip the resist and pull it away from the edge of the contact. The desired effect is to move the resist back away from the contact, and not to necessarily fully strip the resist. Example conditions would be 100 sccm $O_2$, 300 mTorr, 500 Watts, and 100 Gauss. This is followed by a dry physical argon etch, such as 50 sccm Ar, 30 mTorr, 350 Watts, 60 Gauss. The amount of Ar sputter is controlled (minimized) to produce the desired facet, yet not adversely effect the silicon exposed at the base of the contact. The above processes (mask removal and all etching) are all preferably conducted in the same chamber. For purposes of the continuing discussion, outwardly angled sidewalls 48 have an inner base 50 where they join with the original contact opening 44.

Figure 6:
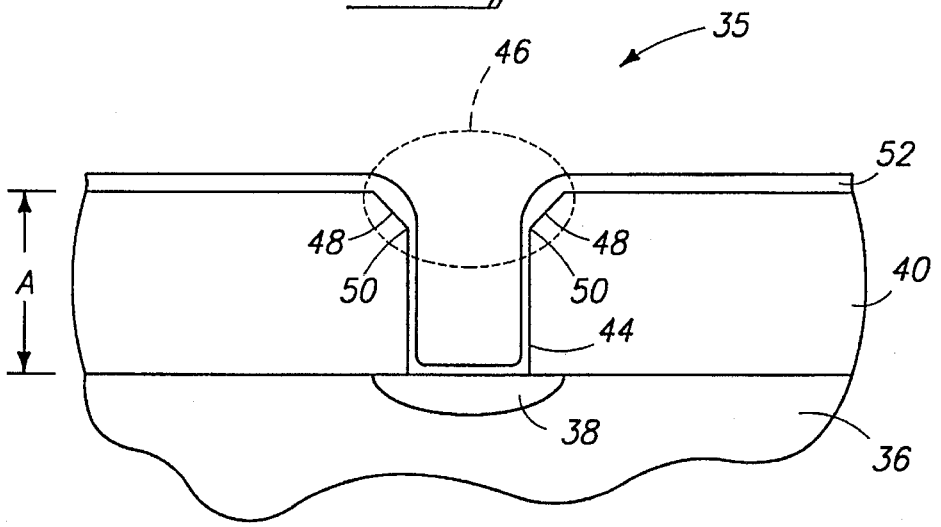
FIG. 6 is a view of the FIG. 4 wafer taken at a processing step subsequent to that shown by FIG. 5.

Referring to FIG. 6, a layer 52 of conductive material (i.e., titanium) is deposited atop the wafer and to within facet etched contact opening 44. Layer 52 less than completely fills contact opening 44. Angled sidewalls 48 relative to contact opening 44 prevent undesired formation of the prior art cusps, which would otherwise have a tendency to pinch-off contact opening 44 as discussed above.

Referring to FIG. 7, a layer 54 of another conductive material, preferably tungsten in accordance with overcoming the specific prior art problem to which this invention was developed, is deposited atop the wafer and to within facet etched contact opening 44 to fill such opening. Collectively, layers 52 and 54 constitute a conductive material which fills contact opening 44. Contact opening 44 might alternately be filled by a single layer deposition. Further alternately, more than three separate or different layers might be deposited to fill contact opening 44. Regardless, angled sidewalls 48 facilitate elimination of cusp formation. Contact opening 44 as patterned can be designed with the minimum photolithographic feature size at its base such that wafer or real estate widening only occurs at the outermost portion or region 46. Accordingly, circuit density can still be maximized while cusp formation is minimized.

Referring to FIG. 8, conductive material 52 and 54 is etched inwardly to at least angled sidewalls' 48 inner base 50 to define an electrically conductive contact plug 56 within contact 44 which electrically connects with substrate region 38. Preferably, the etch is conducted to go slightly below base 50 (FIG. 5) to assure provision of contact plug 56 of the lowest minimum dimensions of contact opening 44. This will provide layer 40 to have a finished thickness "B" which is less than original thickness "A". Accordingly, layer 40 is initially provided to a greater thickness than its desired end-thickness to facilitate providing plug 56 to have external dimensions corresponding to the minimum photolithographic feature size which defines contact opening 44. Accordingly, cusp formation is avoided such that keyholes and fangs are substantially eliminated, and small-size/maximum density goals are not defeated.

The preferred method by which layers 54, 52 and layer 40 are etched is by chemical-mechanical polishing. With the above-described preferred materials, an example chemical-mechanical polishing slurry would include $K_3Fe(CN)_6$ or $H_2O_2$ having dispersed colloidal silica or alumina. Selectivity to oxide polishing can be controlled if desired by varying the percent solids ratio in the slurry. Ultimately however though, oxide polishing is desired to remove layer 40 all the way down to at least sidewall inner base 50. Dry etch could also of course be conducted.

Referring to FIG. 9, the etching can be conducted to finally remove first material of layer 40 at a greater rate than the conductive materials of layer 52 and 54 to cause the final plug 56 to project outwardly of first material layer 40. Such is preferably conducted to assure avoidance of any fang formation, and to provide greater ease and surface area with the subsequently deposited conductive layer for making electrical connection with plug 56.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming an electrically conductive contact plug relative to a wafer comprising the following steps:

providing a substrate to which electrical connection is to be made;

depositing a layer of first material atop the substrate to a selected thickness;

pattern masking the first material layer for formation of a contact opening therethrough;

etching through the first material layer to form the contact opening therethrough for making electrical connection with the substrate, the contact opening having an outermost region;

after etching to form the contact opening, removing the masking from the first material layer;

after removing the masking from the first material layer, etching into the first material layer adjacent the contact opening to provide outwardly angled sidewalls which effectively widen the contact opening outermost region, the outwardly angled sidewalls having an inner base where they join with the original contact opening;

depositing a layer of conductive material atop the wafer and within the etched contact opening to fill the contact opening; and etching the conductive material and first material layer to at least the angled sidewalls' inner base to define an electrically conductive contact plug which electrically connects with the substrate.

2. The semiconductor processing method of claim 1 wherein the first material is electrically insulative.

3. The semiconductor processing method of claim 1 wherein the step of etching to define the plug is conducted to etch the first material at a greater rate than the conductive material to cause the plug to project outwardly of the first material layer.

4. The semiconductor processing method of claim 1 wherein the step of etching to define the plug is conducted by chemical-mechanical polishing or by dry etch back.

5. The semiconductor processing method of claim 1 wherein the step of etching to define the plug is conducted by chemical-mechanical polishing, with the chemical-mechanical polishing being conducted to remove the first material at a greater rate than the conductive material to cause the plug to project outwardly of the first material layer.

6. The semiconductor processing method of claim 1 wherein the first material is electrically insulative, and the step of etching to define the plug is conducted by chemical-mechanical polishing or by dry etch back.

7. The semiconductor processing method of claim 1 wherein the first material is electrically insulative, and the step of etching to define the plug is conducted by chemical-mechanical polishing, with the chemical-mechanical polishing being conducted to remove the first material at a greater rate than the conductive material to cause the plug to project outwardly of the first material layer.

8. The semiconductor processing method of claim 1 wherein the step of depositing the conductive material layer comprises depositing at least two different material conductive layers, a first deposited of the two conductive layers being an adhesion layer for the second deposited of the two conductive layers.

9. The semiconductor processing method of claim 8 wherein the step of etching to define the plug is conducted to etch the first material at a greater rate than the conductive materials to cause the plug to project outwardly of the first material layer.

10. The semiconductor processing method of claim 8 wherein the step of etching to define the plug is conducted by chemical-mechanical polishing or by dry etch back.

11. The semiconductor processing method of claim 8 wherein the step of etching to define the plug is conducted by chemical-mechanical polishing, with the chemical-mechanical polishing being conducted to remove the first material at a greater rate than the conductive materials to cause the plug to project outwardly of the first material layer.

12. A semiconductor processing method of forming an electrically conductive contact plug relative to a wafer comprising the following steps:

providing a substrate to which electrical connection is to be made;

depositing a layer of insulative oxide atop the substrate to a selected thickness;

pattern masking the oxide for formation of a contact opening therethrough;

etching through the oxide to form the contact opening therethrough for making electrical connection with the substrate, the contact opening having an outermost region;

after etching to form the contact opening, removing the masking from the oxide layer;

after removing the masking from the oxide layer, etching into the oxide layer adjacent the contact opening to provide outwardly angled sidewalls which effectively widen the contact opening outermost region, the outwardly angled sidewalls having an inner base where they join with the original contact opening;

depositing a layer of titanium atop the wafer and within the etched contact opening to less than completely fill the contact opening;

depositing a layer of tungsten atop the wafer and within the etched contact opening to fill the contact opening; and etching the titanium, tungsten and oxide layers to at least the angled sidewalls' inner base to define an electrically conductive contact plug which electrically connects with the substrate.

13. The semiconductor processing method of claim 12 wherein the step of etching to define the plug is conducted to etch the oxide at a greater rate than the titanium and tungsten to cause the plug to project outwardly of the oxide layer.

14. The semiconductor processing method of claim 12 wherein the step of etching to define the plug is conducted by chemical-mechanical polishing or by dry etch back.

15. The semiconductor processing method of claim 12 wherein the step of etching to define the plug is conducted by chemical-mechanical polishing, with the chemical-mechanical polishing being conducted to remove the oxide at a greater rate than the titanium and tungsten to cause the plug to project outwardly of the oxide layer.

* * * * *